(12) United States Patent
Pelletier

(10) Patent No.: US 10,677,986 B1
(45) Date of Patent: Jun. 9, 2020

(54) NON-HERMETIC SEMICONDUCTOR OPTICAL AMPLIFIER INTEGRATION ON SILICON PHOTONICS

(71) Applicant: Ciena Corporation, Hanover, MD (US)

(72) Inventor: Francois Pelletier, Quebec (CA)

(73) Assignee: Ciena Corporation, Hanover, MD (US)

( * ) Notice: Subject to any disclaimer, the term of this patent is extended or adjusted under 35 U.S.C. 154(b) by 84 days.

(21) Appl. No.: 16/202,201

(22) Filed: Nov. 28, 2018

(51) Int. Cl.
| G02B 6/14 | (2006.01) |
| G02B 6/122 | (2006.01) |
| G02B 6/126 | (2006.01) |
| G02B 6/12 | (2006.01) |

(52) U.S. Cl.
CPC .............. *G02B 6/14* (2013.01); *G02B 6/122* (2013.01); *G02B 6/126* (2013.01); *G02B 2006/12152* (2013.01)

(58) Field of Classification Search
CPC .......... G02B 6/14; G02B 6/126; G02B 6/122; G02B 2006/12152
See application file for complete search history.

(56) References Cited

U.S. PATENT DOCUMENTS

| 9,759,864 | B2 | 9/2017 | Painchaud et al. |
| 9,823,419 | B1 | 11/2017 | Pelletier et al. |
| 9,851,521 | B2 | 12/2017 | Pelletier et al. |
| 2003/0198434 | A1 | 10/2003 | Lachance et al. |
| 2004/0161197 | A1 | 8/2004 | Pelletier et al. |
| 2013/0022316 | A1 | 1/2013 | Pelletier et al. |
| 2017/0207600 | A1* | 7/2017 | Klamkin ............ G02B 6/12002 |
| 2018/0081118 | A1* | 3/2018 | Klamkin ................. H01S 5/187 |
| 2018/0233606 | A1 | 8/2018 | Pelletier |

* cited by examiner

*Primary Examiner* — John Bedtelyon
(74) *Attorney, Agent, or Firm* — Clements Bernard Walker; Christopher L. Bernard; Lawrence A. Baratta, Jr.

(57) ABSTRACT

Systems and methods for non-hermetic Semiconductor Optical Amplifier (SOA) integration on a Silicon photonic (SiP) chip using Complementary Metal-Oxide-Semiconductor (CMOS) processes include creating a trench for placement of the SOA, wherein the trench is between two Spot Size Converters (SSCs) located on the SiP chip outside of the trench; forming pedestals in the trench in one or more existing CMOS layers of the SiP chip to guide vertical alignment of the SOA with the SSCs during its placement; and depositing metallic traces and a solder pattern in the trench above the pedestals to enable the SOAs to electrically bond and rest on the pedestals during reflow.

20 Claims, 6 Drawing Sheets

NON-HERMETIC SEMICONDUCTOR OPTICAL AMPLIFIER INTEGRATION ON SILICON PHOTONICS

FIELD OF THE DISCLOSURE

The present disclosure generally relates to integrated optical devices. More particularly, the present disclosure relates to systems and methods for non-hermetic Semiconductor Optical Amplifier (SOA) integration on Silicon photonics using Complementary Metal-Oxide-Semiconductor (CMOS) processes.

BACKGROUND OF THE DISCLOSURE

The next generation of coherent transceivers are extremely small requiring novel approaches to accommodate the small space available. For example, a Quad Small Form Factor Pluggable-Double Density (QSFP-DD) is as small as a finger and integrates an Application Specific Integrated Circuit (ASIC), a coherent receiver and transmitter, and a tunable laser. There is practically no room left for amplifying the signal after the modulation. Silicon photonics is well suited for these very compact optical systems but lacks the technology or capacity to amplify the signal intrinsically. There is a need for a very compact and integrated solution into the transmitter function to provide the signal with enough power to achieve the reach required, such as by a QSFP-DD.

Multiple research centers and companies have published papers over the years on heterogeneous and homogeneous integration of optical amplification chips and material onto silicon photonics, including lasers, Semiconductor Optical Amplifiers (SOA) with evanescent coupling, Indium phosphide (InP) growth, and the like. However, there has not been a solution to properly amplify coherent transmitters on-chip that has been demonstrated in production and can be used in a non-hermetic environment. Current solutions include various types of bonding the SOA with evanescent coupling, which is difficult and impractical in production due to high tolerances. Evanescent coupling is difficult to achieve in production due the very high manufacturing precision required. Some other techniques have been presented with side coupling, but lack the precision to have a doubled sided coupling required by the SOA to be inserted into a waveguide path with sufficient precision to achieve passive alignment. Others have presented coupling lasers in the cavity with passive or active alignment or presenting a full non-hermetic solution that achieves a non-hermetic, passively aligned SOA integration into a waveguide path.

There is no known solution that meets the need for on-chip amplification into a waveguide path while using passive alignment assembly equipment for passively aligned SOA integration into a waveguide path and that also provides a non-hermetic approach. Further, all previous solutions do not solve the end to end tolerancing problems to ensure proper and efficient coupling in and out of the chip.

BRIEF SUMMARY OF THE DISCLOSURE

In an embodiment, a method for non-hermetic Semiconductor Optical Amplifier (SOA) integration on a Silicon photonic (SiP) chip using Complementary Metal-Oxide-Semiconductor (CMOS) processes includes creating a trench for placement of the SOA, wherein the trench is between two Spot Size Converters (SSCs) located on the SiP chip outside of the trench; forming pedestals in the trench in one or more existing CMOS layers of the SiP chip to guide vertical alignment of the SOA with the SSCs during its placement; and depositing metallic traces and a solder pattern in the trench above the pedestals to enable the SOAs to electrically bond and rest on the pedestals during reflow.

The method can further include utilizing one or more of scribing, blade dicing, and stealth dicing to achieve an SOA length commensurate for placement within the trench; and placing the SOA in the trench utilizing the pedestals for the alignment. The placing can be performed by a die bonder. The placing can include, subsequent to SOA placement, sending light via a laser through the SiP chip to melt the solder pattern; pushing the SOA against the pedestals utilizing a die bonder that ensures height control of the SOA relative to the SSCs; and stopping the laser, wherein the solder solidifies subsequent to laser stoppage.

The method can further include utilizing an optical adhesive to form an optical junction between the SOA and the SSCs, rendering the SOA insensitive to the environment. The method can further include flip-chip attaching the SiP chip to a substrate. The substrate can include a cavity located where the SOA is integrated into the SiP chip. The SOA can be angled for back-reflection.

In another embodiment, a Silicon photonic (SiP) chip with non-hermetic Semiconductor Optical Amplifier (SOA) integration is formed by a process including the steps of creating a trench for placement of the SOA, wherein the trench is between two Spot Size Converters (SSCs) located on the SiP chip outside of the trench; forming pedestals in the trench in one or more existing CMOS layers of the SiP chip to guide vertical alignment of the SOA with the SSCs during its placement; and depositing metallic traces and a solder pattern in the trench above the pedestals to enable the SOAs to electrically bond and rest on the pedestals during reflow The SiP chip can be further formed by the steps of utilizing one or more of precise scribing, blade dicing, and stealth dicing to achieve an SOA length commensurate for placement within the trench; and placing the SOA in the trench utilizing the pedestals. The placing can be performed by a die bonder. The placing can include, subsequent to SOA placement, sending light via a laser through the SiP chip to melt the solder pattern; pushing the SOA against the pedestals utilizing a die bonder which ensures height control of the SOA relative to the SSCs; and stopping the laser, wherein the solder solidifies subsequent to laser stoppage.

The SiP chip can be further formed by the steps of utilizing an optical adhesive to form an optical junction between the SOA and the SSCs, rendering the SOA insensitive to the environment. The SiP chip can be further formed by the steps of flip-chip attaching the SiP chip to a substrate. The substrate can include a cavity located where the SOA is integrated into the SiP chip. The SOA can be angled for back-reflection.

In a further embodiment, a Silicon photonic (SiP) chip with non-hermetic Semiconductor Optical Amplifier (SOA) integration includes a modulator formed on the SiP chip; a transmitter output formed on the SiP chip; one or more SOAs placed on the SiP chip and connected to the transmitter output, each SOA is placed in a trench on the SiP chip with two Spot Size Converters (SSCs) connected thereto and each of the SSCs are on each side of the trench, wherein each SOA is electrically bonded and rests on pedestals in the trench via deposited metallic traces and solder pattern above the pedestals.

The SOA can be angled for back-reflection. The SiP chip can be a coherent transceiver, and the one or more SOAs includes two SOAs, one for each of an X and Y polarization of a transmitted signal. The two SOAs can be equalized based on the power of the X and Y polarization of the transmitted signal.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for non-hermetic Semiconductor Optical Amplifier (SOA) integration on Silicon photonics using Complementary Metal-Oxide-Semiconductor (CMOS) processes. The systems and methods include a combination of approaches to achieve a passive alignment of the SOA with CMOS processes and backend complimentary processes. The systems and methods provide a solution that solves numerous problems like the hermeticity and the flip-chip compatibility for a coherent receiver. Also, amplifying on each arm the power before Variable Optical Attenuators (VOAs) allows for powerful amplification while maintaining a low Polarization Dependent Loss (PDL).

Silicon Photonics (SiP) Chip

Figure 1:
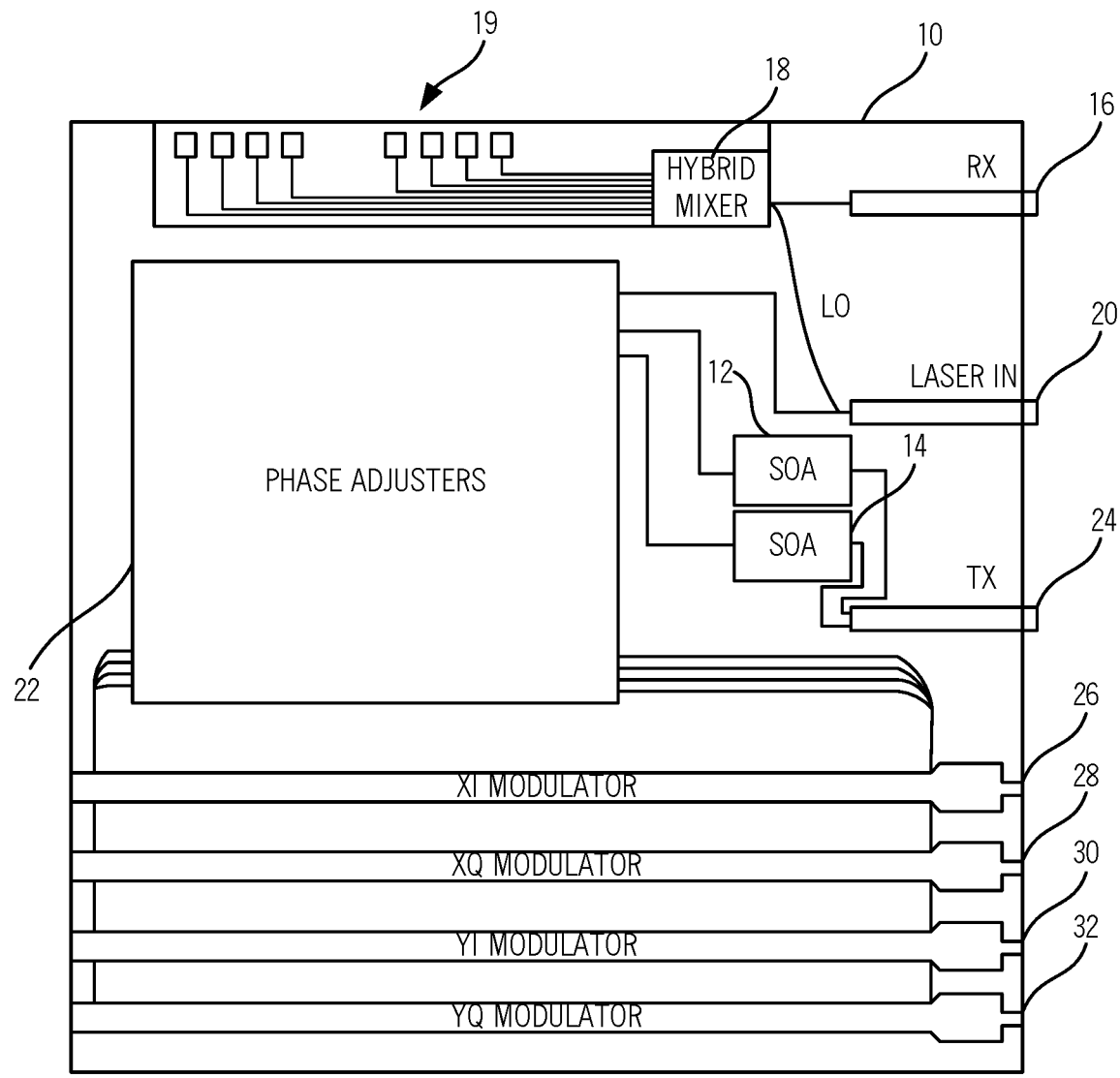
FIG. 1 is a block diagram of a Silicon photonics (SiP) chip with SOAs integrated thereon.

FIG. 1 is a block diagram of a Silicon photonics (SiP) chip 10 with SOAs 12, 14 integrated thereon. In this example, the SiP chip 10 is a coherent transceiver including a coherent receiver (RX) 16 which includes an optical hybrid 18 and high speed photodiodes 19, a laser input 20 which is used both as a Local Oscillator (LO) for the RX 16 and as a light source for a transmitter (TX) 24. The light source is connected to phase adjusters 22, and modulators 26, 28, 30, 32 connected to the phase adjusters 22. The modulators 26, 28, 30, 32 can include arms for dual-polarization (X, Y) and in-phase (I) and quadrature (Q). The I and Q modulators are recombined by the phase adjusters 22 which output the two polarization signals X, Y. The polarizations are recombined before exiting the chip via the transmitter (TX) 24 optical port. Those of ordinary skill in the art will recognize the SiP chip 10 as a coherent transceiver is an example of a SiP chip. The systems and methods also contemplate SOA 12, 14 integration in other types of SiP chips, including different types of coherent transceivers and the like.

The systems and methods include integration of the SOA 12, 14 on the SiP chip 10. The SOAs 12, 14 are optical amplifiers which use a semiconductor to provide a gain medium. Such amplifiers are often used in telecommunication systems in the form of fiber-pigtailed components, operating at signal wavelengths between 0.85 µm and 1.6 µm and generating gains of up to 30 dB. The SiP chip 10 is formed using CMOS processes on wafers and can have dimensions ranging from 150 mm up to 300 mm in diameter (other dimensions are contemplated). The SOA 12, 14 are separately manufactured and assembled (non-hermetic relative to the SiP chip 10) and can have sizes of about 0.5 mm-2.0 mm (other dimensions are contemplated).

In an embodiment, the SOAs 12, 14 may be used in polarization dependent state and therefore inserted before the X and Y polarization transmitted signal is combined, as illustrated in FIG. 1. If the SOAs 12, 14 are polarization insensitive, a single SOA 12 can be used after the X and Y polarization transmitted signal is combined. In an embodiment, the X and Y polarization transmitted signal is amplified after the modulation for maximum SOA range. In an embodiment, the SOAs 12, 14 are placed after the modulator and before tap-VOA-tap to enable equalization of the two arms in power. Also, in an embodiment, the SOA 12, 14 is angled for back-reflection.

Process for SOA Integration on SiP Chip

Figure 2:
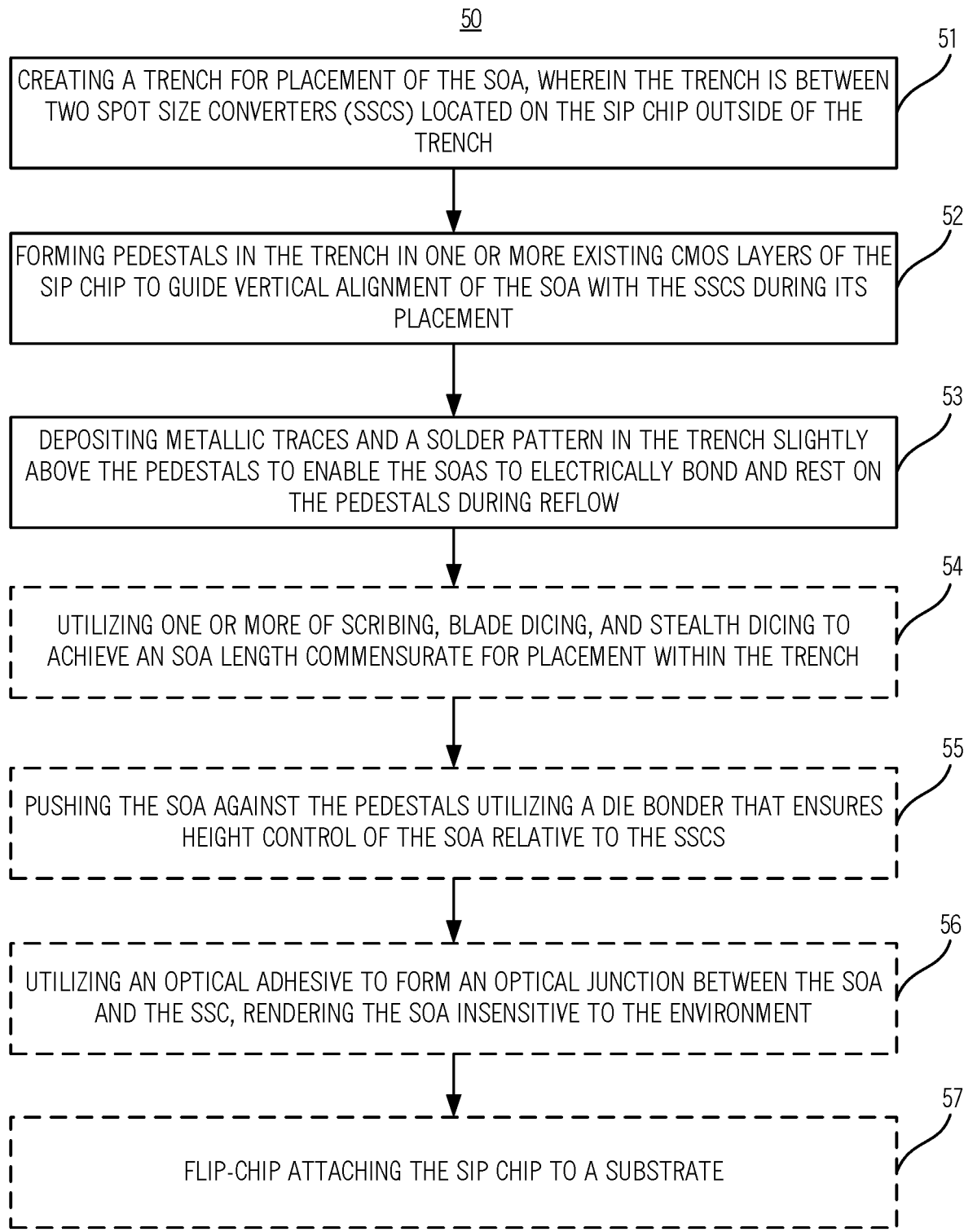
FIG. 2 is a flowchart of a process for non-hermetic Semiconductor Optical Amplifier (SOA) integration on a SiP chip using Complementary Metal-Oxide-Semiconductor (CMOS) processes.

FIG. 2 is a flowchart of a process 50 for non-hermetic Semiconductor Optical Amplifier (SOA) integration on a Silicon photonic (SiP) chip using Complementary Metal-Oxide-Semiconductor (CMOS) processes. The process 50 leverages existing CMOS processes along with a backend process to achieve a passively aligned and non-hermetic amplification solution. Specifically, the process 50 leverages a trenching process described in commonly-assigned U.S. Pat. No. 9,823,419, issued on Nov. 21, 2017, and entitled "Optical coupling surface fabrication," the contents of which are incorporated herein by reference, and a Spot Size Converter (SSC) described in U.S. Pat. No. 9,759,864, issued on Sep. 12, 2017, and entitled "Spot-size converter for optical mode conversion and coupling between two waveguides," the contents of which are incorporated herein by reference. The trenching process and SSC provide an ultra-precise surface for alignment and optical adhesion.

The process 50 includes creating a trench for placement of the SOA, wherein the trench is between two Spot Size Converters (SSCs) located on the SiP chip outside of the trench (step 51). The trench provides an ultra-precise gap necessary for placement of the SOA in the optical path and the trench can be relatively shallow. The ultra-precise gap is based on the alignment tolerance required for power loss. The precision can be less than 0.3 microns on the width and/or length of the cavity. The optical path includes the SSC on either side of the trench for connectivity to the SOA once placed.

The process 50 further includes forming pedestals in the trench in one or more existing CMOS layers of the SiP chip to guide vertical alignment of the SOA with the SSCs during its placement (step 52). Here, existing CMOS layers are used to act as 'pedestals' to precisely align vertically the SOA in front of the SSC (in front as in the end face of the SOA mode converter would be butt coupled to the end face of the trench where the SSC is located). The vertical position can be defined by etch stop in the CMOS process. This could be one of the metal layer, the Germanium (Ge) layer, the Silicon (Si) layer, or any layer that would provide the correct depth for SOA guide alignment. The precision of this depth with respect to the SSC is better typically than 0.5 micron in CMOS process.

The process 50 further includes depositing metallic traces and a solder pattern in the trench slightly above the pedestals to enable the SOAs to electrically bond and rest on the pedestals during reflow (step 53).

The process 50 can further include utilizing one or more of scribing, blade dicing, and stealth dicing to achieve an SOA length commensurate for placement within the trench (step 54). A backgrinding operation can be done before or after the die separation by dicing or scribing, the backgrinding can thin the SiP chip to below 75 microns and enables flip-chip attachment of the SiP chip to a substrate using standard flip-chip processes.

The process 50 can further include placing the SOA in the trench utilizing the pedestals for the alignment (step 55). The placing can be performed by a die bonder. In an embodiment, the lateral positioning can be performed with a precision die bonder that can do a 0.3 micron with 3 sigma on X-Y-Theta. The placing can include, subsequent to SOA placement, sending light via a laser through the SiP chip to melt the solder pattern; pushing the SOA against the pedestals utilizing a die bonder which endures height control of the SOA relative to the SSCs; and stopping the laser, wherein the solder solidifies subsequent to laser stoppage. The solder pattern can be Au—Sn for ultra-fast and precise bonding and flux free process, but other type of solder like Sn—Ag alloy, Bi alloy, In alloy can also be used, assuming that flux or means of reducing the suface oxides prior to soldering are removed completely from the optical surfaces before the next process step.

The process 50 can further include utilizing an optical adhesive to form an optical junction between the SOA and the SSC, rendering the SOA insensitive to the environment (step 56). The optical adhesive can be an index match adhesive to render it insensitive to humidity and be used in non-hermetic environment.

The process 50 can further include flip-chip attaching the SiP chip to a substrate (step 57). The substrate can include a cavity located where the SOA is integrated into the SiP chip. Also, while the process 50 is described in FIG. 2 with the steps 51-57 in a specific order, those skilled in the art will recognize the steps 51-57 may be performed in different orders and some steps 51-57 may be omitted.

Spot Size Converter (SSC)

As described in U.S. Pat. No. 9,759,864, the SSC couples light from a first waveguiding structure supporting a first propagation mode into a second waveguiding structure supporting a second propagation mode, in which the first and second propagation modes have substantially different spot-sizes. The first waveguiding structure may be a submicron strip silicon waveguide on silicon photonics chips. The second waveguiding structure may also be on the silicon photonic chip. Both modes on the SOA may be identical, but may also be different. In either case, the SSC can be adapted to have a very high efficiency.

Precise Scribing or Stealth Dicing

As described in U.S. Pat. No. 9,823,419, manufacturing can include providing a SOA substrate that includes an etched region, transmitting a laser beam into the substrate to produce a stressed region in the substrate, and generating, within the stressed region, a tension to produce a laser-induced breakage region. The laser-induced breakage region produces a predetermined coupling gap between an optical waveguide disposed on the substrate with an optical device. Specifically, the stressed regions may be configured to separate in response to a stress applied on the substrate. For example, the stressed regions may resemble a line or plane within the substrate that separates along the line or plane in response to applied stress. After the substrate separates into two or more substrate portions, resulting laser-induced breakage regions may be found along the side of a resulting substrate portion at the location of the previously stressed regions. Accordingly, the resulting substrate portion may have little or no protrusion along the laser-induced breakage regions. This process can be envisioned for a very precise length of the SOA which will result in a very narrow gap between the SiP chip cavity and SOA. Such a small gap, in a range below 1 um (with a target of <0.5 um) will result in a very high coupling efficiency.

Die Processing

Figure 3:
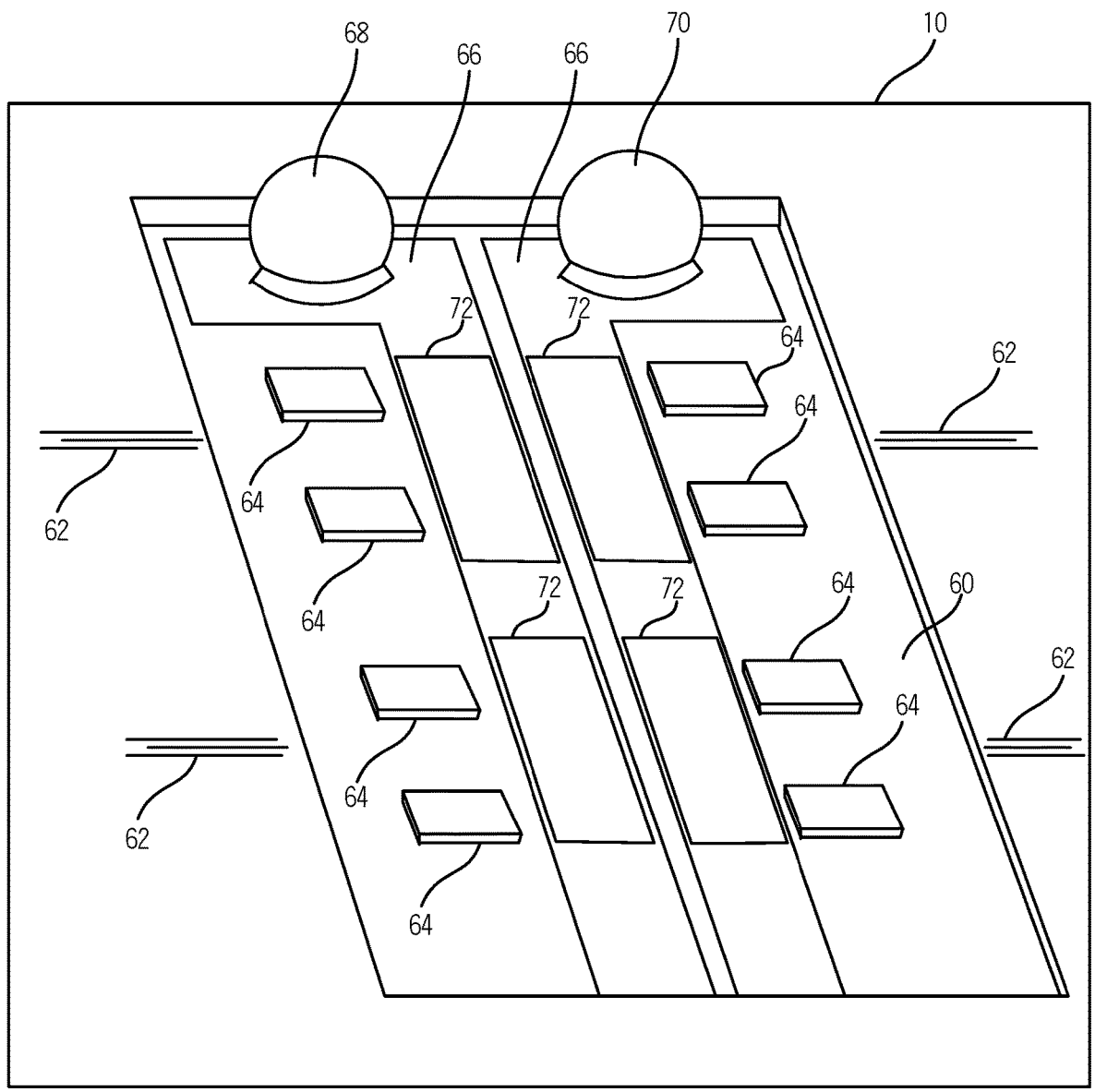
FIG. 3 is a perspective diagram of the SiP chip produced by the process of FIG. 2.

FIG. 3 is a perspective diagram of the SiP chip 10 produced by the process 50. In this example, the SiP chip 10 is processed to support two SOAs 12, 14. The SiP chip 10 includes a trench 60, which can be a depth of about 10 microns, i.e., relatively shallow, and SSCs 62 which are adapted to the Mode Field Diameter (MFD) of the SOAs 12, 14. The SiP chip 10 further includes pedestals 64 formed in the trench 60. The pedestals 64 are formed by an etch stop, and the height is dependent on the relationship between the SSC 62 and a mode converter of the SOA 12, 14. Traces 66 are formed in the trench 60 between the pedestals 64. The traces 66 are for an anode 68 and cathode 70 with Under Bump Metallization (UBM) to accommodate the solder deposition. The traces 66 can have the precision of +/−20 microns. The metal deposition process used for depositing the solder (such as Bi—Sn, In—Sn, Au—Sn) 72 can have a precision of around 5-10 microns without causing precision issue.

SOA Design

The SOAs 12, 14 may be assembled with an angled design for back-reflection. A mode converter may be required to increase the MFD as much as possible to support passive bonding. The dicing (cleaving) has to be precise, ideally around or below 1 micron. Laser stealth dicing or precision cleaving may be used for this precision. The exact precision is based on mode size and expected insertion loss. The die for the SOA 12, 14 should be thinned so a cavity is not necessary in a corresponding substrate for flip-chip attachment, e.g., 50-70 micron thinning is achievable with backgrinding processes. An anti-reflective (AR) coating can be adjusted to minimize the backreflection between the SOA and the SSC effective index 62 (e.g., around 1.45). The SOA 12, 14 can also be adjusted for the P side down (Au—Sn or SAC compatible metallization) with both contacts on a top surface.

SOA Placement

Figure 4:
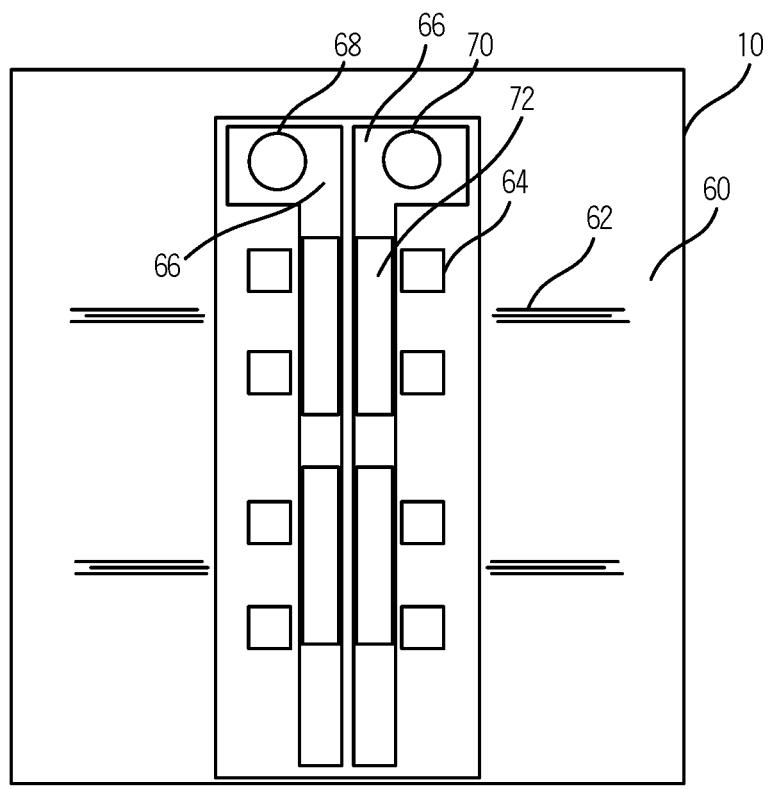
FIGS. 4 and 5 are top view diagrams of the SiP chip illustrating SOA placement.
Figure 5:
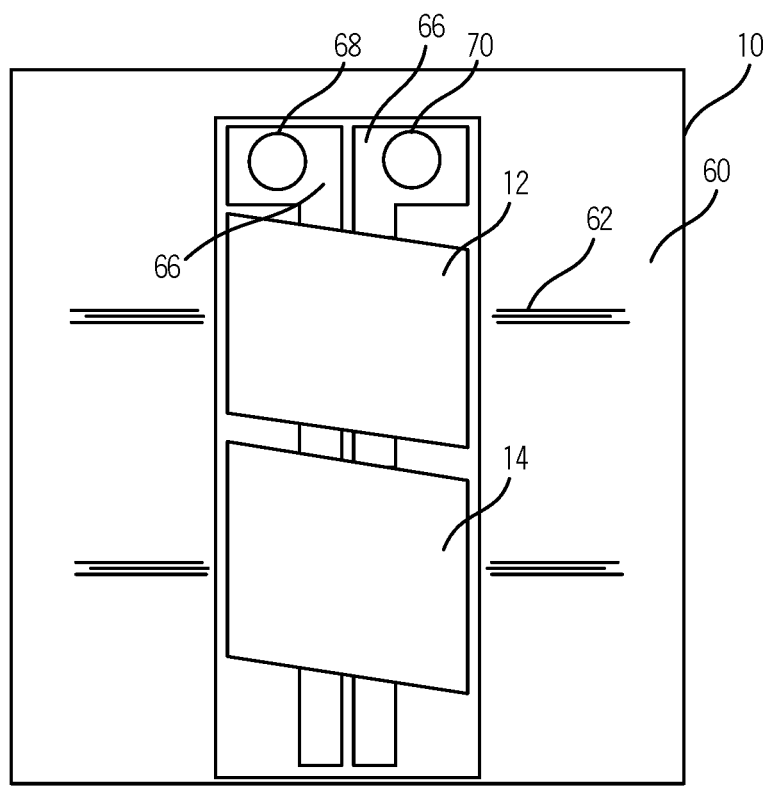

FIGS. 4 and 5 are top view diagrams of the SiP chip 10 illustrating SOA 12, 14 placement. FIG. 4 illustrates the top view of the SiP chip 10 from FIG. 3. The trench 60 can have precision of 0.5 microns. In FIG. 5, the SOAs 12, 14 are placed on the pedestals 64, such as using a precision bonder. Once placed, ultra-fast Au—Sn laser bonding with 0.3 micron accuracy at 3 sigmas can be used.

Figure 6:
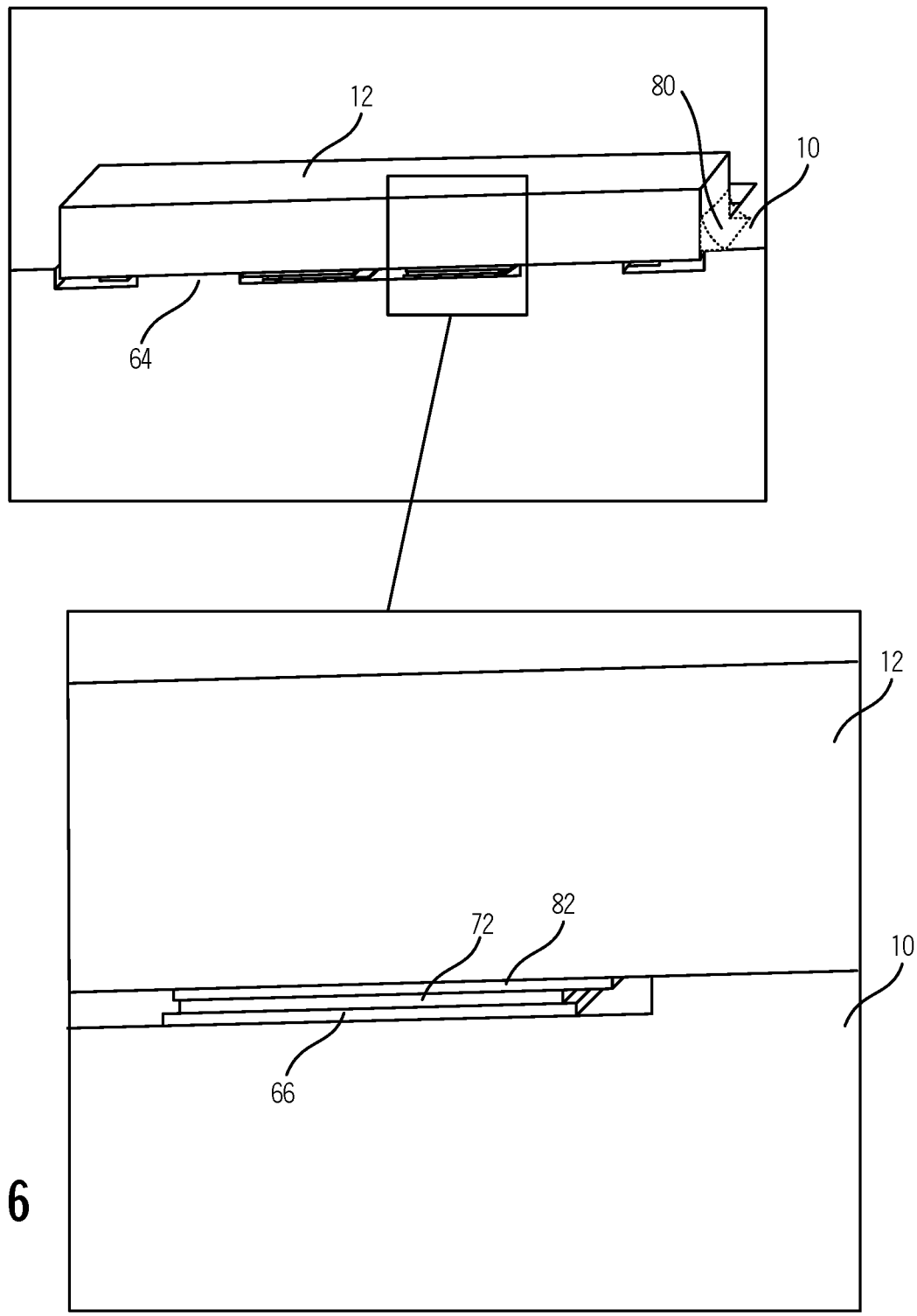
FIG. 6 is a side view diagram of the SiP chip illustrating SOA placement.

FIG. 6 is a side view diagram of the SiP chip 10 illustrating SOA 12 placement. The SOA 12 is placed with a die bonder. Initially, the SOA 12 will rest on the Au—Sn deposition 72 that is thicker than the pedestal 64 before reflow. Light from a laser is fired through the SiP chip 10 to melt the Au—Sn deposition 72. The die bonder pushes the SOA 12 against the pedestals 64, ensuring a precise height control. The laser stops and the solder solidifies instantly. An optical adhesive 80 is placed and cured with Ultraviolet (UV) light. An exploded view in FIG. 6 illustrates SOA 12 metal contacts 82 contacting the solder deposition 72 which contacts the traces 66. In this example, the SOA 12 can be thinned to about 50 microns.

Flip-Chip Attachment

Figure 7:
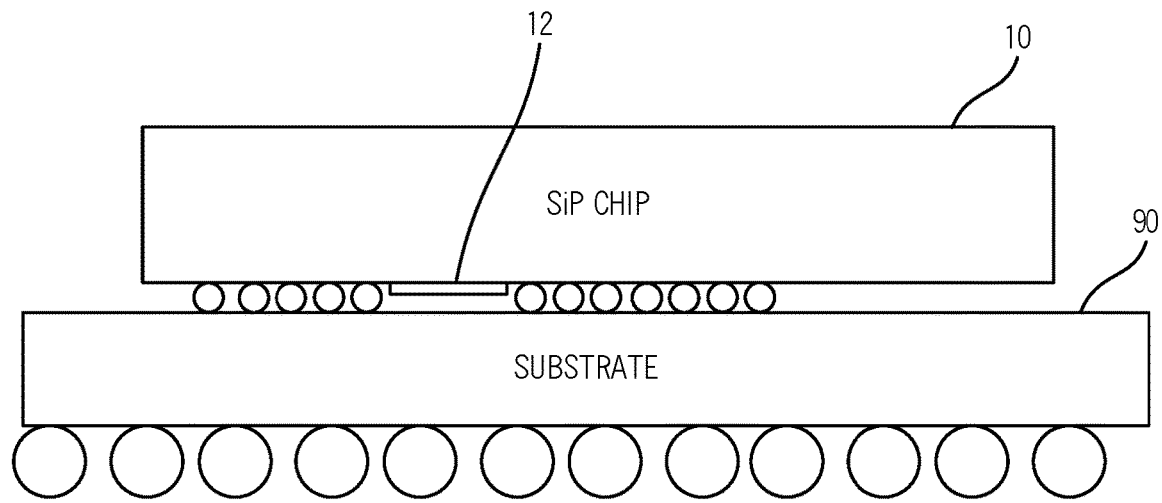
FIGS. 7 and 8 are block diagrams of the SiP chip with the integrated SOA flip-chip attached to a substrate.
Figure 8:
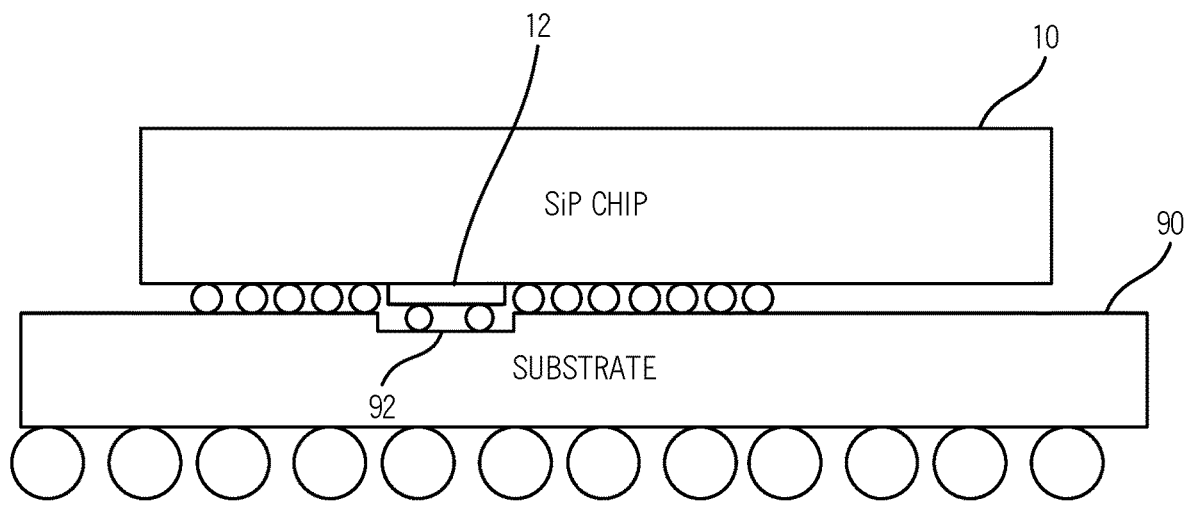

FIGS. 7 and 8 are block diagrams of the SiP chip 10 with the integrated SOA 12 flip-chip attached to a substrate 90.

FIG. 7 illustrates the substrate 90 without a cavity and FIG. 8 illustrates the substrate 90 with a cavity 92 to accommodate a larger size SOA 12. Again, in an embodiment, the SiP chip 10 with the integrated SOA 12 can be used in a pluggable small form factor such as the OSFP or QSFP-DD module. The SiP chip 10 with the integrated SOA 12 is flip-chip compatible while being non-hermetic.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method for non-hermetic Semiconductor Optical Amplifier (SOA) integration on a Silicon photonic (SiP) chip using Complementary Metal-Oxide-Semiconductor (CMOS) processes, the method comprising:
    creating a trench for placement of the SOA, wherein the trench is between two Spot Size Converters (SSCs) located on the SiP chip outside of the trench;
    forming pedestals in the trench in one or more existing CMOS layers of the SiP chip to guide vertical alignment of the SOA with the SSCs during its placement; and
    depositing metallic traces and a solder pattern in the trench above the pedestals to enable the SOAs to electrically bond and rest on the pedestals during reflow.

2. The method of claim 1, further comprising:
    utilizing one or more of scribing, blade dicing, and stealth dicing to achieve an SOA length commensurate for placement within the trench; and
    placing the SOA in the trench utilizing the pedestals for the alignment.

3. The method of claim 2, wherein the placing is performed by a die bonder.

4. The method of claim 2, wherein the placing comprises:
    subsequent to SOA placement, sending light via a laser through the SiP chip to melt the solder pattern;
    pushing the SOA against the pedestals utilizing a die bonder that ensures height control of the SOA relative to the SSCs; and
    stopping the laser, wherein the solder solidifies subsequent to laser stoppage.

5. The method of claim 2, further comprising:
    utilizing an optical adhesive to form an optical junction between the SOA and the SSCs, rendering the SOA insensitive to the environment.

6. The method of claim 2, further comprising:
    flip-chip attaching the SiP chip to a substrate.

7. The method of claim 6, wherein the substrate includes a cavity located where the SOA is integrated into the SiP chip.

8. The method of claim 2, wherein the SOA is angled for back-reflection.

9. A Silicon photonic (SiP) chip with non-hermetic Semiconductor Optical Amplifier (SOA) integration formed by a process comprising the steps of:
    creating a trench for placement of the SOA, wherein the trench is between two Spot Size Converters (SSCs) located on the SiP chip outside of the trench;
    forming pedestals in the trench in one or more existing CMOS layers of the SiP chip to guide vertical alignment of the SOA with the SSCs during its placement; and
    depositing metallic traces and a solder pattern in the trench above the pedestals to enable the SOAs to electrically bond and rest on the pedestals during reflow.

10. The SiP chip of claim 8, further comprising the steps of:
    utilizing one or more of precise scribing, blade dicing, and stealth dicing to achieve an SOA length commensurate for placement within the trench; and
    placing the SOA in the trench utilizing the pedestals.

11. The SiP chip of claim 9, wherein the placing is performed by a die bonder.

12. The SiP chip of claim 9, wherein the placing comprises:
    subsequent to SOA placement, sending light via a laser through the SiP chip to melt the solder pattern;
    pushing the SOA against the pedestals utilizing a die bonder which ensures height control of the SOA relative to the SSCs; and
    stopping the laser, wherein the solder solidifies subsequent to laser stoppage.

13. The SiP chip of claim 9, further comprising the steps of:
    utilizing an optical adhesive to form an optical junction between the SOA and the SSCs, rendering the SOA insensitive to the environment.

14. The SiP chip of claim 9, further comprising the steps of:
    flip-chip attaching the SiP chip to a substrate.

15. The SiP chip of claim 13, wherein the substrate includes a cavity located where the SOA is integrated into the SiP chip.

16. The SiP chip of claim 9, wherein the SOA is angled for back-reflection.

17. A Silicon photonic (SiP) chip with non-hermetic Semiconductor Optical Amplifier (SOA) integration, the SiP chip comprising:
    a modulator formed on the SiP chip;
    a transmitter output formed on the SiP chip;
    one or more SOAs placed on the SiP chip and connected to the transmitter output, each SOA is placed in a trench on the SiP chip with two Spot Size Converters (SSCs) connected thereto and each of the SSCs are on each side of the trench,
    wherein each SOA is electrically bonded and rests on pedestals in the trench via deposited metallic traces and solder pattern above the pedestals.

18. The SiP chip of claim 17, wherein the SOA is angled for back-reflection.

19. The SiP chip of claim 17, wherein the SiP chip is a coherent transceiver, and the one or more SOAs includes two SOAs, one for each of an X and Y polarization of a transmitted signal.

20. The SiP chip of claim 19, wherein the two SOAs are equalized based on the power of the X and Y polarization of the transmitted signal.

* * * * *